United States Patent
You

(10) Patent No.: US 7,821,308 B2
(45) Date of Patent: Oct. 26, 2010

(54) DELAY LOCKED LOOP AND METHOD OF CONTROLLING THE SAME

(75) Inventor: Min Young You, Ichon (KR)

(73) Assignee: Hynix Semiconductor Inc. (KR)

( * ) Notice: Subject to any disclaimer, the term of this patent is extended or adjusted under 35 U.S.C. 154(b) by 291 days.

(21) Appl. No.: 11/963,502

(22) Filed: Dec. 21, 2007

(65) Prior Publication Data

US 2009/0015302 A1 Jan. 15, 2009

(30) Foreign Application Priority Data

Jul. 12, 2007 (KR) ........................ 10-2007-0070193

(51) Int. Cl.
*H03L 7/06* (2006.01)
(52) U.S. Cl. ........................ 327/158; 327/149
(58) Field of Classification Search .................. 327/149, 327/158
See application file for complete search history.

(56) References Cited

U.S. PATENT DOCUMENTS

| | | | | |
|---|---|---|---|---|
| 6,711,090 B2* | 3/2004 | Fujimori | ................ | 365/189.15 |
| 6,813,197 B2 | 11/2004 | Park | | |
| 6,989,700 B2* | 1/2006 | Kim | ............... | 327/158 |
| 7,103,133 B2 | 9/2006 | Jung | | |
| 7,119,591 B1* | 10/2006 | Lin | ............... | 327/158 |
| 7,154,311 B2 | 12/2006 | Lim | | |
| 7,170,313 B2 | 1/2007 | Shin | | |
| 7,388,415 B2* | 6/2008 | Lee | ............... | 327/158 |
| 7,414,447 B2* | 8/2008 | Cho | ............... | 327/158 |
| 7,486,119 B2* | 2/2009 | Lee | ............... | 327/158 |
| 7,605,622 B2* | 10/2009 | Choi et al. | .............. | 327/158 |
| 7,642,823 B2* | 1/2010 | Cho | ............... | 327/156 |
| 7,672,191 B2* | 3/2010 | Jang | .............. | 365/233.12 |
| 2006/0267649 A1 | 11/2006 | Park et al. | | |
| 2007/0018702 A1* | 1/2007 | Lee | ............... | 327/158 |
| 2007/0188206 A1* | 8/2007 | Lee | ............... | 327/158 |
| 2008/0079469 A1* | 4/2008 | Cho | ............... | 327/158 |
| 2008/0239846 A1* | 10/2008 | Ku | ............... | 365/194 |
| 2008/0272812 A1* | 11/2008 | Cho | ............... | 327/158 |
| 2009/0015302 A1* | 1/2009 | You | ............... | 327/158 |
| 2009/0115474 A1* | 5/2009 | Lee | ............... | 327/158 |
| 2009/0289677 A1* | 11/2009 | Mizukane et al. | ........... | 327/158 |

FOREIGN PATENT DOCUMENTS

| | | |
|---|---|---|
| JP | 2005-251370 | 9/2005 |
| KR | 1020070036547 A | 4/2007 |
| KR | 1020070036562 A | 4/2007 |
| KR | 100733466 | 6/2007 |
| KR | 1020070070962 A | 7/2007 |

* cited by examiner

*Primary Examiner*—Lincoln Donovan
*Assistant Examiner*—Adam D Houston
(74) *Attorney, Agent, or Firm*—Baker & McKenzie LLP

(57) ABSTRACT

A delay locked loop includes a DLL hold control unit that receives a first control signal and outputs a DLL hold control signal, and a DLL block that receives the DLL hold control signal and generates a DLL clock.

18 Claims, 6 Drawing Sheets

DELAY LOCKED LOOP AND METHOD OF CONTROLLING THE SAME

CROSS-REFERENCE TO RELATED PATENT APPLICATION

This application claims priority under 35 U.S.C. 119(a) to Korean Patent Application No. 10-2007-0070193, filed on Jul. 12, 2007 in the Korean Intellectual Property Office, the disclosure of which is incorporated herein in its entirety by reference as if set forth in full.

BACKGROUND

1. Technical Field

The embodiments described herein relate to a semiconductor integrated circuit, and more particularly, to a DLL (delay locked loop) circuit and a method of controlling the same.

2. Related Art

In general, delay locked loops are used to match the phase of a clock input from outside of a semiconductor integrated circuit with the phase of a clock used in the semiconductor integrated circuit.

In a CKE intensive precharge power down mode, when the level of a clock enable signal "CKE" is alternated between a high level and a low level in units of 3 to 4 clocks, precharge power-down does not occur.

FIG. 1 is a block diagram illustrating a conventional delay locked loop according to related art. The delay locked loop shown in FIG. 1 includes a DLL test control unit 30 and a DLL block 20.

The DLL test control unit 30 receives a test mode signal "TM" and outputs a DLL test mode hold control signal "TDLLHOLD." The DLL test control unit 30 encodes a test mode signal for testing the performance of the DLL block 20.

The DLL block 20 receives an external clock signal "CLK" and generates a DLL clock signal "CLKDLL." The DLL block 20 includes a DLL clock buffer 21, a clock driver 22, a DLL variable delay unit 23, a DLL delay control unit 26, a replica delay unit 24, a phase detecting unit 25, and a DLL control unit 27.

The operation of the delay locked loop shown in FIG. 1 will now be described in detail. First, when the test mode signal "TM" transitions to a high level, the DLL test mode hold signal "TDLLHOLD" changes to a high level. Therefore, the DLL delay control unit 26 receives a high-level DLL test mode hold signal "TDLLHOLD" and fixes the delay time of the DLL variable delay unit 23. Therefore, the DLL block 20 generates a DLL clock signal "CLKDLL" that has a fixed phase.

However, when entering a CKE intensive precharge power-down mode, in a standby mode of the delay locked loop, a bank is precharged and a clock enable signal "CKE" changes from a high level to a low level. Then, most of the internal circuits are turned off in order to reduce current consumption. The delay locked loop is turned off after a predetermined amount of time has elapsed in the power down mode. At that time, a delay correcting circuit of the delay locked loop is turned on. The delay correcting circuit in the on state updates the phase of the DLL clock.

In a conventional delay locked loop, in a CKE intensive precharge power down mode, for a predetermined period of time after the clock enable signal "CKE" changes from a high level to a low level, a large voltage drop occurs in a DLL voltage (VDDL) that is applied to the delay locked loop, but a small voltage drop occurs in a power supply voltage (VDD) for internal circuits other than the delay locked loop. Therefore, the level of the DLL voltage (VDDL) is lower than that of the power supply voltage (VDD). Accordingly, at the beginning of the power down mode, the phase of the DLL clock is corrected at a high DLL voltage (VDDL), and when the power down mode ends, the phase of the DLL clock is corrected at a low DLL voltage (VDDL). As a result, a phase difference occurs in the DLL clock, and a DLL lock fail occurs in a system supplied with unstable power.

SUMMARY

A delay locked loop and methods of controlling the same capable of preventing a DLL lock fail before and after a power down mode (e.g., a CKE intensive precharge power down mode, etc.) are described herein.

According to one aspect, a delay locked loop includes a DLL hold control unit that is configured to receive a first control signal and output a DLL hold control signal, and a DLL block that is configured to receive the DLL hold control signal and generate a DLL clock signal.

According to another aspect, there is provided a method of controlling a delay locked loop. The method includes outputting a DLL hold control signal that is enabled when a first control signal is enabled, and generating a DLL clock signal in response to the enabled DLL hold control signal.

These and other features, aspects, and embodiments are described below in the section entitled "Detailed Description."

BRIEF DESCRIPTION OF THE DRAWINGS

Features, aspects, and embodiments are described in conjunction with the attached drawings, in which.

DETAILED DESCRIPTION

Figure 1:
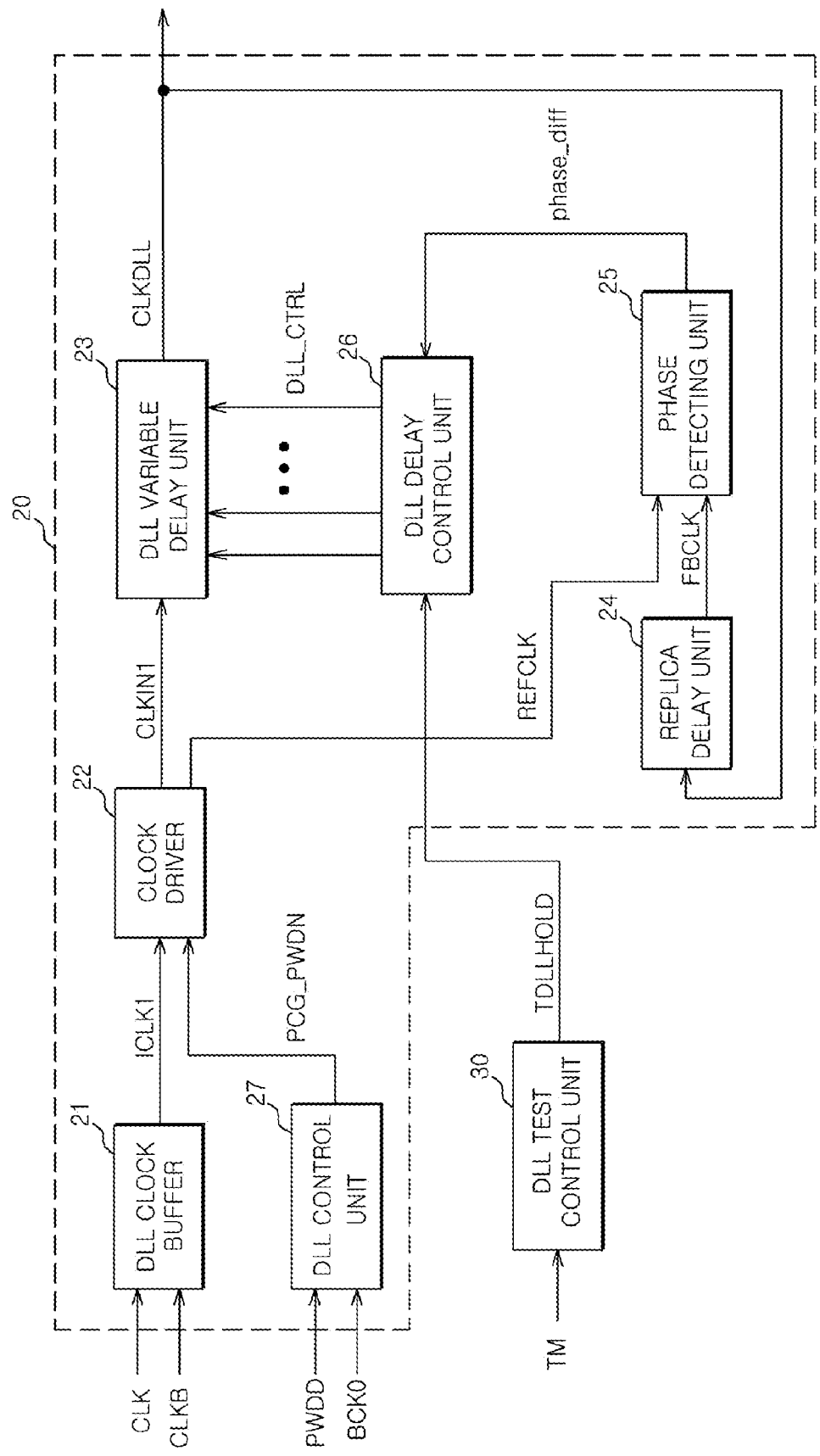
FIG. 1 is a block diagram illustrating an exemplary delay locked loop.
Figure 2:
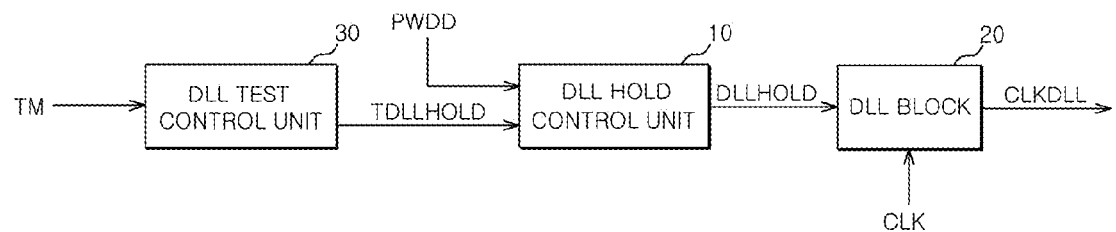
FIG. 2 is a block diagram illustrating a delay locked loop, in accordance with one embodiment.

Referring to FIG. 2, a delay locked loop can include a DLL test control unit 30, a DLL hold control unit 10, and a DLL block 20.

The DLL hold control unit 10 can be configured to receive a first control signal "PWDD" and output a DLL hold control signal "DLLHOLD." The DLL hold control signal "DLLHOLD" can be used to fix or vary the delay time of a DLL variable delay unit of the DLL block 20 in response to the first control signal "PWDD."

The first control signal "PWDD" can be transitioned from a high level to a low level in a power down mode, and can use a clock enabled signal "CKE" or a power down mode signal. For example, the first control signal "PWDD" can be a precharge power down enable signal. The power down mode can include, for example, a precharge power down mode and a CKE intensive precharge power down mode.

When the first control signal "PWDD" is enabled, the DLL hold control unit 10 can be configured to output the DLL hold control signal "DLLHOLD" to fix the delay time of the DLL block 20. When the first control signal "PWDD" is enabled to be the power down mode, the DLL block 20 can be configured to receive the DLL hold control signal "DLLHOLD" and output a DLL clock signal "CLKDLL" to which a delay time before the power down mode is applied. While in the power down mode, the DLL variable delay unit of the DLL block 20 can be configured to be held or turned off by the DLL hold control signal "DLLHOLD."

In a conventional circuit, in a CKE intensive precharge power down mode the delay locked loop is turned off after a predetermined amount of time (for example, 3 to 4 clock periods) has elapsed. When the delay locked loop is turned on, the delay time of the DLL variable delay unit also varies. In this case, different DLL voltages are applied to the delay locked loop in the CKE intensive precharge power down mode and the other modes. When the delay locked loop is turned on, the phase of the DLL clock signal is updated, and a phase difference between the power down mode and the other modes occurs due to the voltage difference. Therefore, when the power down mode ends, a phase difference occurs in the DLL clock signal due to the voltage difference, which results in a DLL lock failure. The DLL lock failure means an error in the data input/output characteristics due to the DLL clock signal "CLKDLL" has occurred. That is, the phase difference of the DLL clock signal "CLKDLL" causes the distortion of data that is output in synchronization with the DLL clock signal "CLKDLL."

In certain embodiments described herein, however, during the CKE intensive precharge power down mode, the delay locked loop can operate according to a fixed delay time, which can be a delay time immediately before the power down mode. Therefore, in the power down mode, the phase of the DLL clock signal can remain not updated. As a result, the delay locked loop according to such embodiments can reduce the DLL lock failures.

Alternatively, in another embodiment, the DLL hold control unit 10 can be configured to further receive a DLL test mode hold signal "TDLLHOLD" and output a DLL hold control signal "DLLHOLD" that can be enabled when the DLL test mode hold signal "TDLLHOLD" or the first control signal "PWDD" is enabled.

Figure 3:
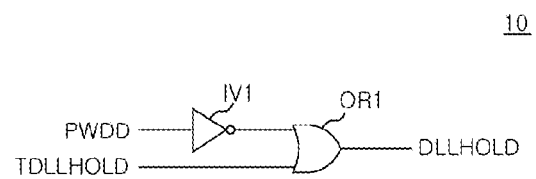
FIG. 3 is a detailed circuit diagram illustrating a DLL hold control unit that can be included in the delay locked loop shown in FIG. 2, in accordance with one embodiment.

More specifically, as shown in FIG. 3, the DLL hold control unit 10 can be configured to include an OR gate (OR1) that can receive the first control signal "PWDD" and the DLL test mode hold signal "TDLLHOLD" and output the DLL hold control signal "DLLHOLD."

In response to an output signal from the DLL hold control unit 10, the DLL block 20 can be configured to fix the delay time of the DLL variable delay unit, and generate a DLL clock signal "CLKDLL" to which the fixed delay time is applied. The DLL block 20 can include a DLL variable delay unit. Therefore, the DLL block 20 can be configured to receive an internal clock signal and generate a DLL clock signal "CLKDLL" having a phase difference from the internal clock signal using the DLL variable delay unit.

The internal clock signal can be obtained by processing an external clock "CLK" input to the DLL block 20 from the outside using a clock buffer and a clock driver.

The DLL test control unit 30 can be configured to receive a test mode signal "TM" and output a DLL test mode hold signal "TDLLHOLD." The DLL test control unit 30 can further be configured to encode a test mode signal for testing the performance of the DLL block 20. For example, the DLL test control unit 30 can include a fuse. In this case, when a desired test mode is enabled, similar to the test mode signal "TM," the DLL test control unit 30 can cut the fuse to encode a mode register set "MRS."

Figure 4:
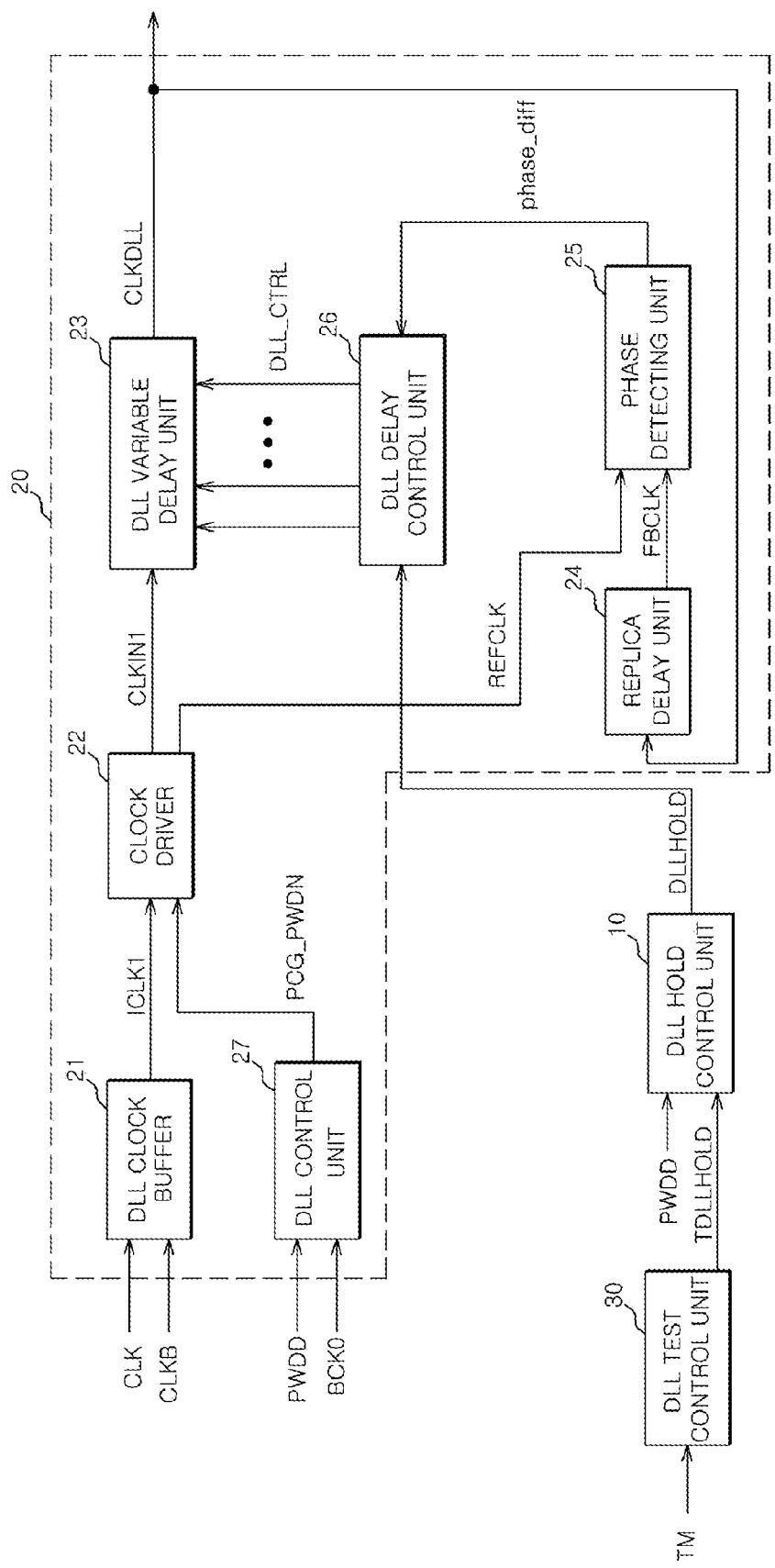
FIG. 4 is a detailed block diagram illustrating the delay locked loop shown in FIG. 2, in accordance with one embodiment.

Specifically, as shown in FIG. 4, the DLL block 20 can include a DLL clock buffer 21, a clock driver 22, a DLL variable delay unit 23, a replica delay unit 24, a phase detecting unit 25, a DLL control unit 27, and a DLL delay control unit 26.

The DLL clock buffer 21 can be configured to receive and buffer the external clock signal "CLK," then generate a first internal clock signal "ICLK1." The DLL clock buffer 21 can be composed of a general buffer.

The clock driver 22 can be configured to receive the first internal clock signal "ICLK1," drive the received clock signal, and generate a second internal clock signal "CLKIN1" and a reference clock signal "REFCLK." The reference clock signal "REFCLK" can be input to the phase detecting unit 25, and the second internal clock "CLKIN1" can be input to the DLL variable delay unit 23. The clock driver 22 can be composed of a general clock driver that can receive or output signals in the same method as described above.

The DLL variable delay unit 23 can be configured to receive the second internal clock signal "CLKIN1," and delay the received clock signal by a delay time corresponding to a DLL delay control signal "DLL_CTRL" to generate the DLL clock signal "CLKDLL." The DLL variable delay unit 23 can be a general variable delay circuit.

The replica delay unit 24 can be configured to receive the DLL clock signal "CLKDLL" and delay the received clock signal by a predetermined amount of time to generate a feedback clock signal "FBCLK." The replica delay unit 24 can be a replica delay unit used for a general delay locked loop.

The phase detecting unit 25 can be configured to detect a phase difference between the reference clock signal "REFCLK" and the feedback clock signal "FBCLK" and output a phase signal "phase_diff" to the DLL delay control unit 26. The phase detecting unit 25 can be a general phase detector.

The DLL control unit 27 can be configured to receive a command clock signal "BCK0" and the first control signal "PWDD" and generate a precharge power down mode signal "PCG_PWDN." The command clock signal "BCK0" can be a command internal clock signal, and is typically not under the control of the first control signal and the precharge power down mode signal in the precharge power down mode.

The DLL delay control unit 26 can be configured to output a DLL delay control signal "DLL_CTRL" in response to the DLL hold control signal "DLLHOLD." When the DLL hold control signal "DLLHOLD" is enabled, the DLL delay control unit 26 can be configured to output the DLL delay control signal "DLL_CTRL" to fix the delay time. Therefore, the DLL block 20 can be configured to receive the DLL delay control signal "DLL_CTRL" and generate a DLL clock signal "CLKDLL" to which the fixed delay time is applied.

The operation of the delay locked loop according to this embodiment will be described below with reference to FIGS. 2 to 4.

In a standby mode, when a bank is precharged and the clock enable signal "CKE" changes from a high level to a low level (the first control signal "PWDD" changes from a high level to a low level) and the DLL hold control signal "DLLHOLD" can be enabled. Then, the DLL delay control unit 26 can be configured to output an enabled DLL delay control signal "DLL_CTRL." Therefore, the DLL variable delay unit 23 can be configured to apply a delay time that is equal to that immediately before the power down mode to the first internal clock signal "ICLK1" to generate a DLL clock signal "CLKDLL."

The delay time of the DLL variable delay unit 23 can be fixed in order to generate the DLL clock signal "CLKDLL." Therefore, the DLL block 20 can be configured to generate the DLL clock signal "CLKDLL" to which the delay time immediately before the power down mode is applied and which is not affected by variation in the DLL voltage (VDDL) in the power down mode. As a result, it is possible to reduce DLL lock failures.

Figure 5:
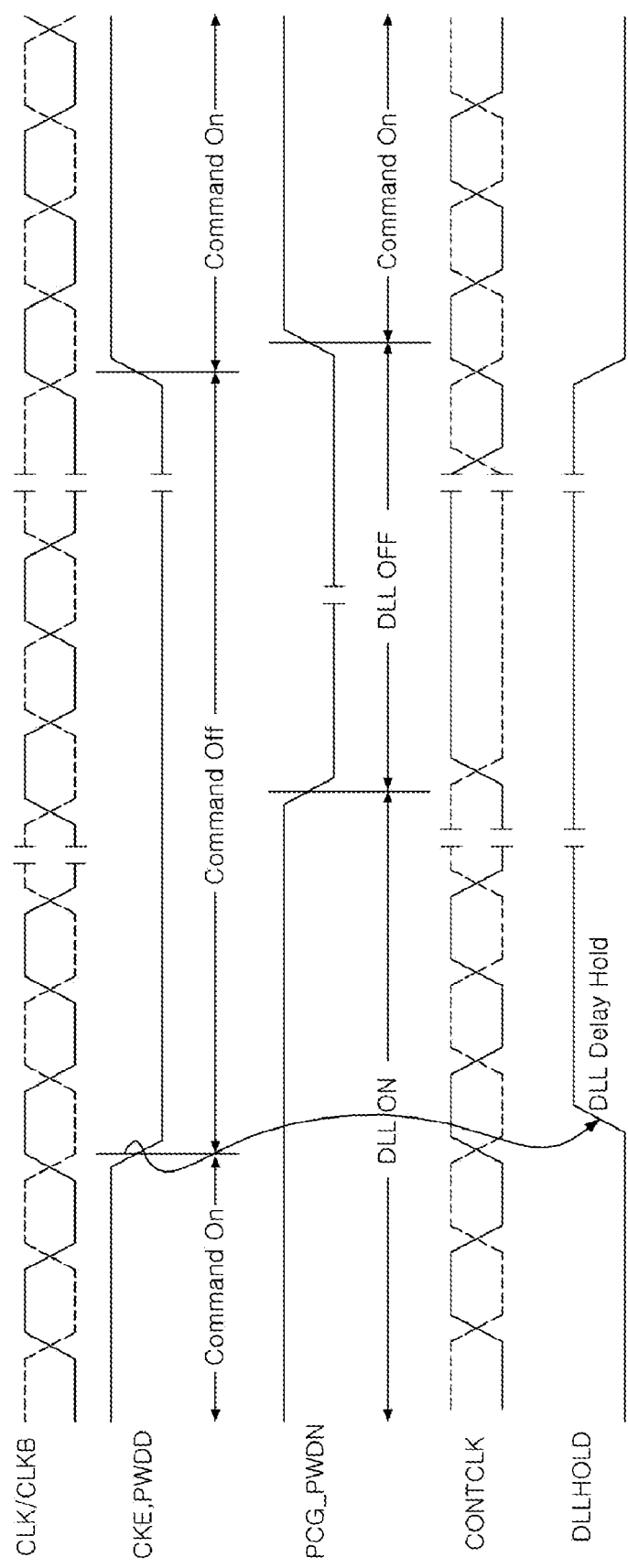
FIG. 5 is a timing chart illustrating the operation of the delay locked loop shown in FIG. 4.

FIG. 5 is a timing chart illustrating the operation of the delay locked loop shown in FIG. 4.

In the power down mode, the clock enable signal "CKE" can change from a high level to a low level, and the first control signal "PWDD" can change from a high level to a low level. In this embodiment, the DLL hold control signal "DLLHOLD" can change from a low level to a high level when the first control signal "PWDD" is enabled. When the DLL hold control signal "DLLHOLD" is enabled, the DLL delay control signal "DLL_CTRL" can be enabled. As a result, the DLL clock signal "CLKDLL" having the fixed delay time applied thereto can be generated.

Figure 6:
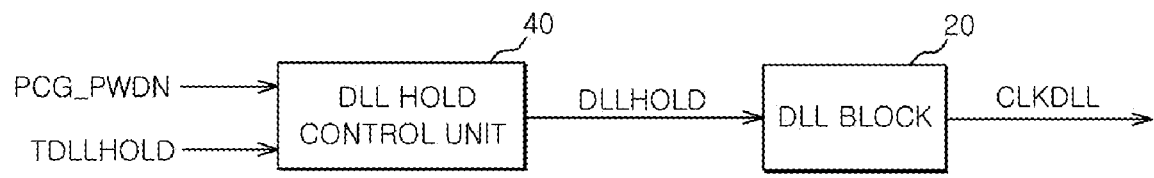
FIG. 6 is a block diagram illustrating a delay locked loop, in accordance with another embodiment.

Referring to FIG. 6, a delay locked loop, according to another embodiment, can include a DLL hold control unit 40 and a DLL block 20.

The DLL hold control unit 40 can be configured to receive a precharge power down mode signal "PCG_PWDN" or the DLL test mode hold signal "TDLLHOLD" and output the DLL hold control signal "DLLHOLD." The delay locked loop shown in FIG. 2 differs from that shown in FIG. 6 in that the delay locked loop shown in FIG. 2 can receive the first control signal "PWDD," but the delay locked loop shown in FIG. 6 typically receives the precharge power down mode signal "PCG_PWDN."

The DLL block 20 can be configured to fix the delay time of the DLL variable delay unit according to the DLL hold control signal "DLLHOLD" and generate a DLL clock signal "CLKDLL" having the fixed delay time applied thereto.

Figure 7:
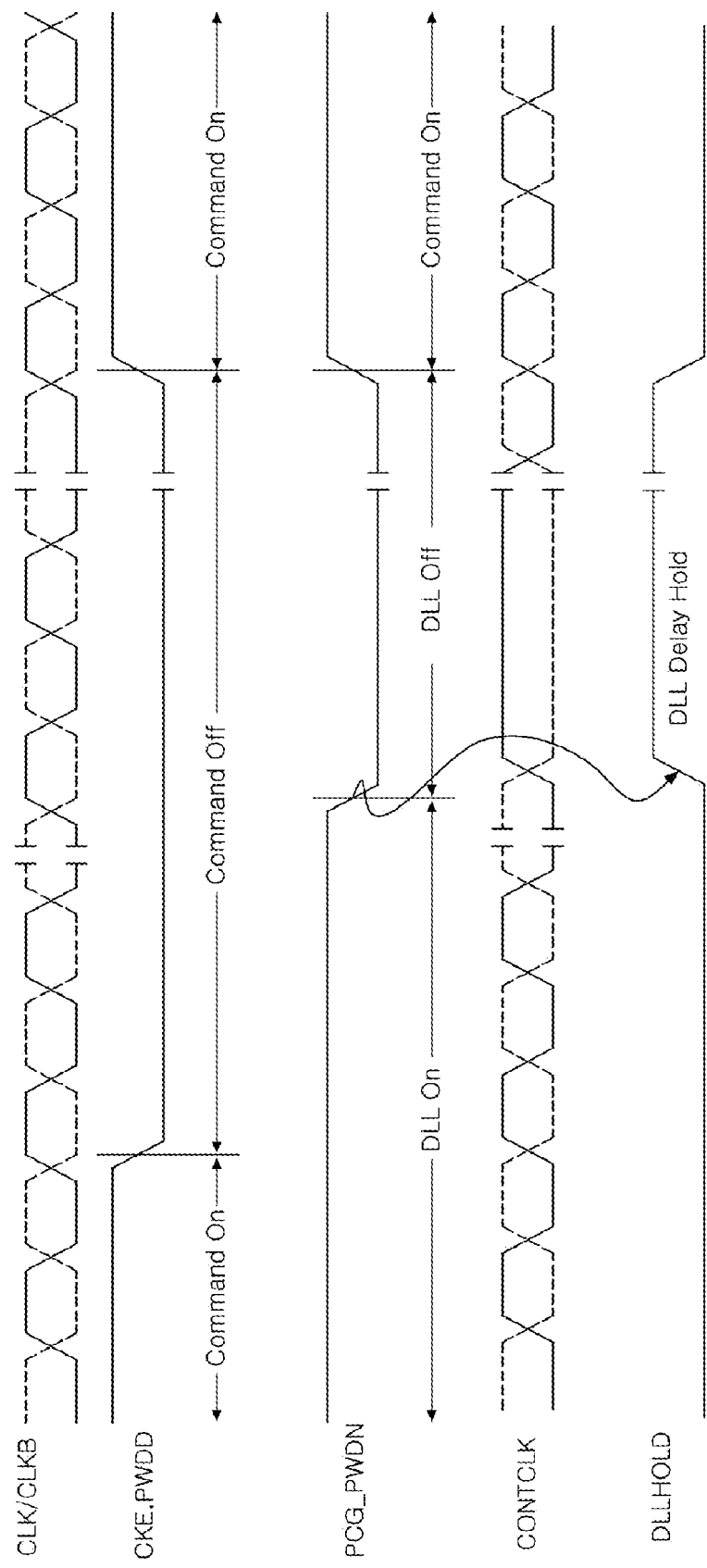
FIG. 7 is a timing chart illustrating the operation of the delay locked loop shown in FIG. 6.

The operation of the delay locked loop shown in FIG. 6 will be described with reference to FIG. 7. The precharge power down mode signal "PCG_PWDN" can change from a high level to a low level after a predetermined amount of time delay (3 to 4 clocks) after the power down mode starts. Then, the DLL hold control signal "DLLHOLD" can be enabled after the precharge power down mode signal "PCG_PWDN" changes to the low level, and the DLL clock signal "CLKDLL" having a fixed delay time is generated.

The delay locked loop according to this embodiment can also be applied to duty cycle correcting circuits and semiconductor integrated circuits including delay locked loops.

While certain embodiments have been described above, it will be understood that the embodiments described are by way of example only. Accordingly, the apparatus and methods described herein should not be limited based on the described embodiments. Rather, the apparatus and methods described herein should only be limited in light of the claims that follow when taken in conjunction with the above description and accompanying drawings.

What is claimed is:

1. A delay locked loop comprising:
a DLL hold control unit that receives a first control signal and outputs a DLL hold control signal; and
a DLL block that receives the DLL hold control signal and generates a DLL clock,
wherein the DLL block fixes a delay time of a DLL variable delay unit according to the DLL hold control signal.

2. The delay locked loop of claim 1,
wherein the DLL hold control unit further receives a DLL test mode hold signal and outputs the DLL hold control signal.

3. The delay locked loop of claim 2, further comprising:
a DLL test control unit that receives a test mode signal and outputs the DLL test mode hold signal.

4. The delay locked loop of claim 3,
wherein the test mode signal is encoded by a mode register set (MRS).

5. The delay locked loop of claim 3,
wherein the DLL hold control unit outputs the DLL hold control signal that is enabled when the first control signal is enabled or the DLL test mode hold signal is enabled.

6. The delay locked loop of claim 1,
wherein the DLL block includes:
a DLL delay control unit that outputs the DLL delay control signal in response to the DLL hold control signal;
the DLL variable delay unit that delays an internal clock according to the DLL delay control signal to generate a DLL clock;
a replica delay unit that delays the DLL clock by a predetermined amount of time; and
a phase detecting unit that compares the phase of an output signal from the replica delay unit with the phase of a reference clock, and outputs a phase signal to the DLL delay control unit.

7. The delay locked loop of claim 6,
wherein the DLL block further includes:
a DLL clock buffer that receives an external clock and buffers the received clock; and
a clock driver that receives an output signal from the DLL clock buffer and generates the internal clock.

8. The delay locked loop of claim 2,
wherein the DLL test mode hold signal is enabled in a test mode.

9. The delay locked loop of claim 1,
wherein the first control signal is a clock enable signal or a power down mode signal.

10. The delay locked loop of claim 1,
wherein the delay locked loop is included in a duty cycle correcting circuit.

11. The delay locked loop of claim 1,
wherein, when the first control signal is enabled, a CKE intensive precharge power down mode starts.

12. A method of controlling a delay locked loop, comprising:
outputting a DLL hold control signal that is enabled when a first control signal is enabled;
generating a DLL clock in response to the enabled DLL hold control signal; and
fixing the phase of the DLL clock in response to the enabled DLL hold control signal.

13. The method of claim 12,
wherein the outputting of the DLL hold control signal includes outputting the DLL hold control signal that is enabled when the first control signal or a DLL test mode hold signal is enabled.

14. The method of claim 13,
wherein the outputting of the DLL hold control signal further includes:

receiving a test mode signal and outputting the DLL test mode hold signal.

15. The method of claim 12,
wherein the fixing of the phase of the DLL clock further includes:
   outputting a DLL delay control signal in response to the enabled DLL hold control signal; and
   fixing a delay time of a DLL variable delay unit of a DLL block in response to the DLL delay control signal, and generating the DLL clock.

16. The method of claim 12,
wherein the first control signal is a clock enable signal or a power down mode signal.

17. The method of claim 12,
wherein the delay locked loop is included in a duty cycle correcting circuit.

18. The method of claim 12,
wherein, when the first control signal is enabled, a CKE intensive precharge power down mode starts.

* * * * *